United States Patent
Xiao et al.

(10) Patent No.: US 11,322,091 B2
(45) Date of Patent: May 3, 2022

(54) PIXEL CIRCUIT, DISPLAY PANEL, AND COMPENSATION METHOD OF REFERENCE VOLTAGE OF PIXEL CIRCUIT

(71) Applicant: Shenzhen China Star Optoelectronics Semiconductor Display Technology Co., Ltd., Shenzhen (CN)

(72) Inventors: Xiang Xiao, Shenzhen (CN); Yan Xue, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 146 days.

(21) Appl. No.: 16/757,394

(22) PCT Filed: Feb. 17, 2020

(86) PCT No.: PCT/CN2020/075594
§ 371 (c)(1),
(2) Date: Apr. 19, 2020

(87) PCT Pub. No.: WO2021/138965
PCT Pub. Date: Jul. 15, 2021

(65) Prior Publication Data
US 2021/0407416 A1   Dec. 30, 2021

(30) Foreign Application Priority Data
Jan. 7, 2020   (CN) .......................... 202010012085.0

(51) Int. Cl.
*G09G 3/3258*   (2016.01)
*G09G 3/3266*   (2016.01)
*H01L 27/32*    (2006.01)

(52) U.S. Cl.
CPC ......... *G09G 3/3258* (2013.01); *G09G 3/3266* (2013.01); *H01L 27/3262* (2013.01);
(Continued)

(58) Field of Classification Search
CPC .. G09G 3/3258; G09G 3/3266; G09G 3/3233; G09G 3/3275; G09G 2300/0426;
(Continued)

(56) References Cited

U.S. PATENT DOCUMENTS 9,262,963 B2   2/2016 Toyomura
10,347,177 B2 * 7/2019 Zhang ................. G09G 3/3233
(Continued)

FOREIGN PATENT DOCUMENTS

CN   104715716   6/2015
CN   109979377   7/2019
(Continued)

*Primary Examiner* — Nitin Patel
*Assistant Examiner* — Amen W Bogale

(57) ABSTRACT

Provided are a pixel circuit, a display panel, and a compensation method of a reference voltage of a pixel circuit, including a plurality of pixel internal driving circuits arranged in an array. The internal driving circuit of each pixel includes: a first thin film transistor (T1), a second thin film transistor (T2), a fourth thin film transistor (T4), a first capacitor (C1), an organic light emitting diode (D1), and a compensation module. By setting the compensation module, the compensation module is connected to a scan signal (EM). An end of the compensation module is connected to a first node (G), and another end of the compensation module is connected to a power supply voltage (VDD). The compensation module is configured to compensate a potential drop of the first node (G) due to coupling of the first capacitor (C1).

13 Claims, 4 Drawing Sheets

(52) U.S. Cl.
 CPC ............... *G09G 2300/043* (2013.01); *G09G 2300/0876* (2013.01)

(58) Field of Classification Search
 CPC ..... G09G 2300/0876; G09G 2300/043; G09G 2300/0439; G09G 2300/0819; G09G 2320/045; G09G 2320/0233
 See application file for complete search history.

(56) References Cited

U.S. PATENT DOCUMENTS

| | | | |
|---|---|---|---|
| 11,189,225 B1* | 11/2021 | Heganovic | G09G 3/3233 |
| 2006/0077194 A1* | 4/2006 | Jeong | G09G 3/3233 |
| | | | 345/204 |
| 2009/0219232 A1* | 9/2009 | Choi | G09G 3/3266 |
| | | | 345/76 |
| 2015/0170569 A1 | 6/2015 | Han et al. | |
| 2015/0279266 A1 | 10/2015 | Onoyama et al. | |
| 2016/0351125 A1* | 12/2016 | Zhou | G09G 3/3233 |
| 2018/0330670 A1 | 11/2018 | Han et al. | |
| 2019/0244568 A1* | 8/2019 | Ling | G09G 3/3233 |
| 2020/0043417 A1* | 2/2020 | Yang | G09G 3/3291 |
| 2020/0168156 A1* | 5/2020 | Yin | G09G 3/3258 |
| 2020/0265780 A1* | 8/2020 | Qing | G09G 3/3233 |
| 2021/0217362 A1* | 7/2021 | Xu | G09G 3/3275 |
| 2021/0407417 A1* | 12/2021 | Dong | G09G 3/2092 |

FOREIGN PATENT DOCUMENTS

| | | |
|---|---|---|
| CN | 110310603 | 10/2019 |
| CN | 110491326 | 11/2019 |
| JP | 2009-288590 | 12/2009 |
| KR | 10-0707624 | 4/2007 |

\* cited by examiner

US 11,322,091 B2

PIXEL CIRCUIT, DISPLAY PANEL, AND COMPENSATION METHOD OF REFERENCE VOLTAGE OF PIXEL CIRCUIT

RELATED APPLICATIONS

This application is a National Phase of PCT Patent Application No. PCT/CN2020/075594 having International filing date of Feb. 17, 2020, which claims the benefit of priority of Chinese Patent Application No. 202010012085.0 filed on Jan. 7, 2020. The contents of the above applications are all incorporated by reference as if fully set forth herein in their entirety.

FIELD AND BACKGROUND OF THE INVENTION

The present disclosure relates to the field of display technologies, and more particularly to a pixel circuit, a display panel, and a compensation method of a reference voltage of a pixel circuit.

Organic light emitting diodes (OLEDs) are a self-luminous display technology with advantages of wide viewing angles, high contrast, low power consumption, and bright colors. Due to the advantages, the proportion in the display industry is increasing year by year. Oxide thin film transistors are widely used in large-size AMOLEDs due to their high mobility and good uniformity. However, as panels are used for a longer period of time, electrical properties of thin film transistors and OLEDs will drift, eventually failing due to issues such as uneven display.

Technical Problem

As shown in FIG. 1, a pixel circuit of a conventional active matrix organic light emitting diode (AMOLED) is 3T1C. When a Data signal is written to a G node, a voltage at the G node drops due to coupling of a capacitor C1 when a gate of T2 is closed. This causes current flowing through T1 to change (as indicated by a mark 10 in FIG. 2, a current curve climbs fluctuates), and coupling of a panel's unused position is different, which causes the panel to emit light unevenly.

Therefore, there is an urgent need to provide a new pixel circuit, a display panel, and a compensation method of a reference voltage of a pixel circuit to compensate for a potential drop of a first node (G) due to coupling of a first capacitor (C1) to improve display uniformity of a panel.

SUMMARY OF THE INVENTION

An object of the present invention is to provide a photoresist peeling device and a photoresist peeling method. By adding a MOF material to a filter element of a filter device, the material can capture oxygen in a solution under visible light, thereby reducing dissolved oxygen in the solution, and further reduce the oxygen concentration difference between the inside and outside of the gap, and alleviate the hollowing out of copper caused by the peeling photoresist of the substrate; further, when it reaches saturation, it can be heated or ultraviolet light to release the oxygen it adsorbs, and further the filter element material can be recycled.

An object of the present invention is to provide a pixel circuit, a display panel, and a compensation method of a reference voltage of a pixel circuit to compensate for a potential drop of a first node (G) due to coupling of a first capacitor (C1) to improve display uniformity of a panel.

To achieve the above object, an embodiment of the present invention provides a pixel circuit comprising a plurality of pixel internal driving circuits arranged in an array; each of the pixel internal driving circuits comprises: a first thin film transistor (T1), wherein a gate of the first thin film transistor (T1) is electrically connected to a first node (G), a source of the first thin film transistor is electrically connected to a second node (S); and a drain of the first thin film transistor is connected to a power supply voltage (VDD); a second thin film transistor (T2), wherein a gate of the second thin film transistor is connected to a writing signal (WR), a source of the second thin film transistor is connected to a data signal (Data), and a drain of the second thin film transistor is electrically connected to the first node (G); a first capacitor (C1), an end thereof is connected to the first node (G), and another end thereof is connected to a second node (S); a fourth thin film transistor (T4), wherein a gate of the fourth thin film transistor is connected to a reading signal (RD), a source of the fourth thin film transistor is electrically connected to the second node (S), and a drain of the fourth thin film transistor is electrically connected to a reference voltage signal (Ref); an organic light emitting diode (D1), wherein an anode of the organic light emitting diode (D1) is electrically connected to the second node (S), and a cathode of the organic light emitting diode (D1) is connected to a power supply voltage (VSS); and a compensation module connected to a scan signal (EM), wherein an end of the compensation module is connected to the first node (G), and another end thereof is connected to the power supply voltage (VDD) to compensate a potential drop of the first node (G) caused by coupling of the first capacitor (C1).

In an embodiment of the present invention, the compensation module comprises a third thin film transistor (T3) and a second capacitor (Cp); a gate of the third thin film transistor is connected to the scan signal (EM), a source of the third thin film transistor is electrically connected to the first node (G), and a drain of the third thin film transistor is electrically connected to an end of the second capacitor (C2); another end of the second capacitor (Cp) is electrically connected to the power supply voltage (VDD).

In an embodiment of the present invention, the third thin film transistor (T3) has the same aspect ratio as the second thin film transistor (T2).

In an embodiment of the present invention, the first thin film transistor (T1), the second thin film transistor (T2), the third thin film transistor (T3), and the fourth thin film transistor (T4) are all low temperature polysilicon thin film transistors, oxide semiconductor thin film transistors, or amorphous silicon thin film transistors.

In an embodiment of the present invention, the writing signal (WR) and the scan signal (EM) are provided by an external timing controller; and/or the scan signal (EM) is consistent with a delay load of the writing signal (WR).

In an embodiment of the present invention, a combination of the writing signal (WR), the scan signal (EM), and the data signal (Data) corresponds to a writing phase and a light emitting phase in sequence; in the writing phase, the write signal (WR) provides a high potential, the scan signal (EM) provides a low potential, and the data signal (Data) provides a high potential; and in the light emitting phase, the write signal (WR) provides a low potential, the scan signal (EM) provides a high potential, and the data signal (Data) provides a low potential.

In an embodiment of the present invention, in the writing phase, a difference between the low potential provided by the scan signal (EM) and a threshold voltage of the first thin film transistor is greater than a voltage of the data signal of a highest gray level.

In an embodiment of the present invention, the pixel circuit further comprises an NMOS circuit, a PMOS circuit, or a CMOS circuit.

An embodiment of the present invention further comprises a display panel comprising the pixel circuit, and the display panel is an active matrix organic light emitting diode (AMOLED) display panel.

An embodiment of the present invention further comprises a method of compensating a reference voltage of a pixel circuit, comprising following steps: providing the pixel circuit; entering a writing phase, in the writing phase, wherein the writing signal (WR) provides a high potential, the scan signal (EM) provides a low potential, and the data signal (Data) provides a high potential after a delay, the second thin film transistor (T2), the third thin film transistor (T3), and the fourth thin film transistor (T4) are all turned on, and the data signal (Data) and the reference voltage (Vref) write initial potentials to the first node (G) and the second node (S), respectively; entering a light emitting phase, in the light emitting phase, wherein the writing signal (WR) provides a low potential, the scan signal (EM) provides a high potential, and the data signal (Data) provides a low potential after a delay, the second thin film transistor (T2) and the third thin film transistor (T3) are turned off, and the power supply voltage (VDD) starts to charge the second node (S), the potential of the first node (G) decreases due to coupling of the first capacitor (C), the scan signal (EM) pulls the potential of the first node (G) high through the compensation module, so that the reference voltage Vgs remains unchanged.

Beneficial Effect

Embodiments of the present invention provide a pixel circuit, a display panel, and a compensation method of a reference voltage of a pixel circuit. By setting a compensation module, the compensation module is connected to a scan signal (EM). An end of the compensation module is connected to a first node (G), and another end of the compensation module is connected to a power supply voltage (VDD). The compensation module is configured to compensate a potential drop of the first node (G) due to coupling of the first capacitor (C1). This keeps a reference voltage Vgs constant, current flowing through a driving thin film transistor (i.e., the first thin film transistor) does not change, and a panel emits light uniformly.

Figure 1:
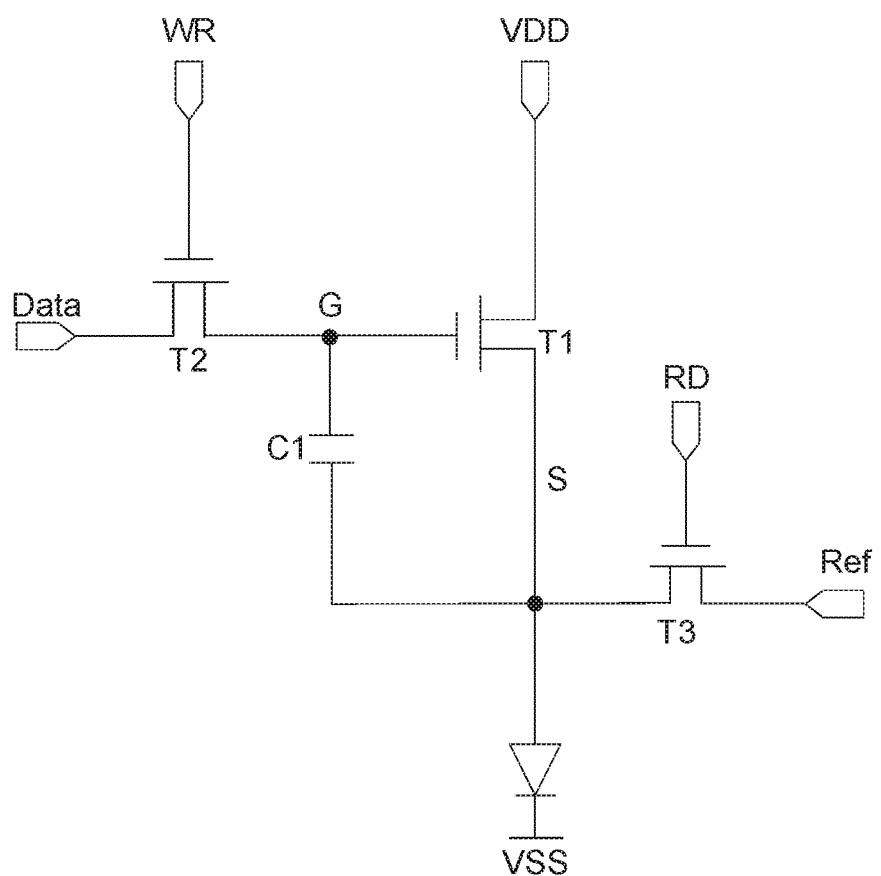
FIG. 1 is a circuit diagram of a pixel hybrid compensation circuit in the prior art.
Figure 2:
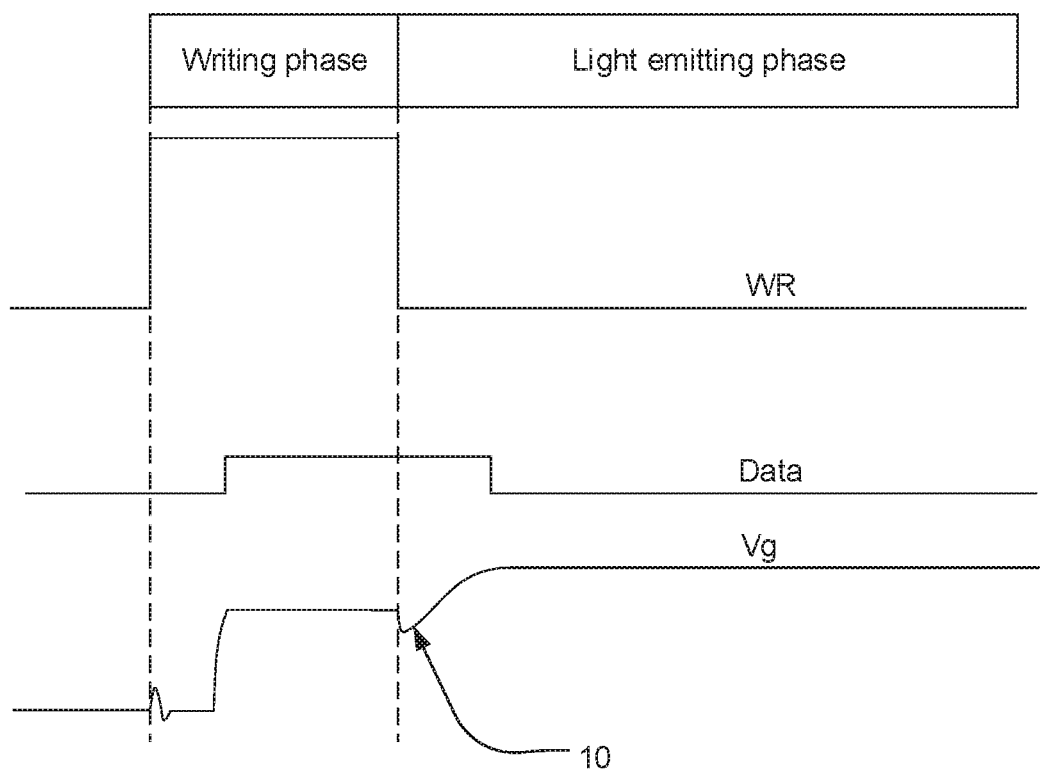
FIG. 2 is a timing diagram of a pixel hybrid compensation circuit in the prior art.

Pixel hybrid compensation circuit 100; external compensation circuit 200.

Analog-to-digital converter 201; voltage comparator 202; control module 203.

Memory 204; digital-to-analog converter 205.

DESCRIPTION OF SPECIFIC EMBODIMENTS OF THE INVENTION

In order to make the purpose, technical solution, and effect of the present application clearer and more definite, the present application is further described in detail below with reference to the accompanying drawings and examples. It should be understood that the specific embodiments described herein are only used to explain the present application and are not used to limit the present application.

Figure 3:
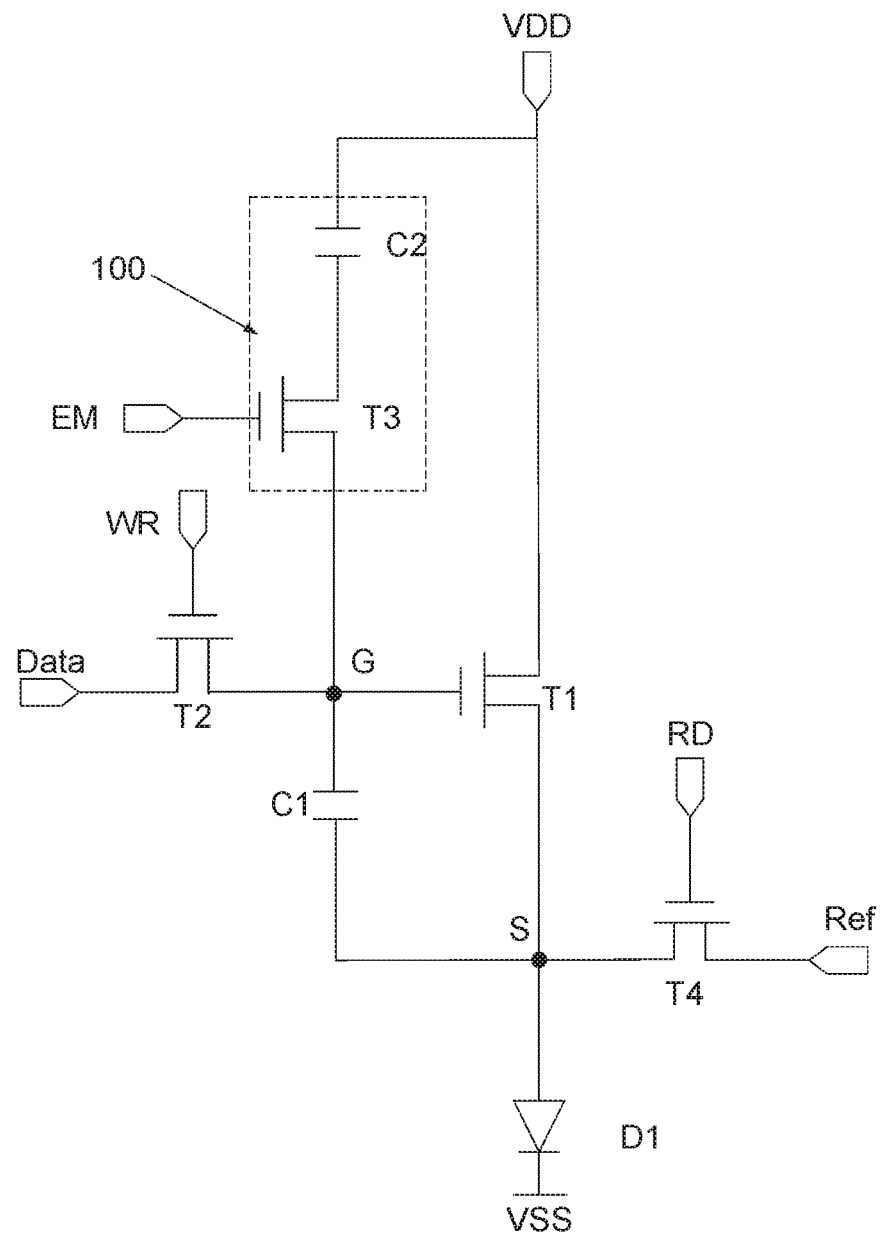
FIG. 3 is a circuit diagram of a pixel hybrid compensation circuit according to an embodiment of the present invention.

Referring to FIG. 3, an embodiment of the present invention provides a pixel circuit comprising a plurality of pixel internal driving circuits arranged in an array.

Each of the pixel internal driving circuits comprises: a first thin film transistor (T1), a second thin film transistor (T2), a fourth thin film transistor (T4), a first capacitor (C1), an organic light emitting diode (D1), and a compensation module.

A gate of the first thin film transistor (T1) is electrically connected to a first node (G), a source of the first thin film transistor is electrically connected to a second node (S); and a drain of the first thin film transistor is connected to a power supply voltage (VDD).

A gate of the second thin film transistor is connected to a writing signal (WR), a source of the second thin film transistor is connected to a data signal (Data), and a drain of the second thin film transistor is electrically connected to the first node (G).

An end of the first capacitor (C1) is connected to the first node (G), and another end of the first capacitor (C1) is connected to a second node (S).

A gate of the fourth thin film transistor is connected to a reading signal (RD), a source of the fourth thin film transistor is electrically connected to the second node (S), and a drain of the fourth thin film transistor is electrically connected to a reference voltage signal (Ref).

An anode of the organic light emitting diode (D1) is electrically connected to the second node (S), and a cathode of the organic light emitting diode (D1) is connected to a power supply voltage (VSS).

The compensation module is connected to a scan signal (EM). An end of the compensation module is connected to the first node (G), and another end thereof is connected to the power supply voltage (VDD) to compensate a potential drop of the first node (G) caused by coupling of the first capacitor (C1). This keeps a reference voltage Vgs constant, current flowing through a driving thin film transistor (i.e., the first thin film transistor) does not change, and a panel emits light uniformly.

The compensation module comprises a third thin film transistor (T3) and a second capacitor (Cp).

A gate of the third thin film transistor is connected to the scan signal (EM), a source of the third thin film transistor is electrically connected to the first node (G), and a drain of the third thin film transistor is electrically connected to an end of the second capacitor (C2). The third thin film transistor (T3) has the same aspect ratio as the second thin film transistor (T2).

Another end of the second capacitor (Cp) is electrically connected to the power supply voltage (VDD).

The first thin film transistor (T1), the second thin film transistor (T2), the third thin film transistor (T3), and the fourth thin film transistor (T4) are all low temperature polysilicon thin film transistors, oxide semiconductor thin film transistors, or amorphous silicon thin film transistors.

The writing signal (WR) and the scan signal (EM) are provided by an external timing controller; and/or the scan signal (EM) is consistent with a delay load of the writing signal (WR).

Figure 4:
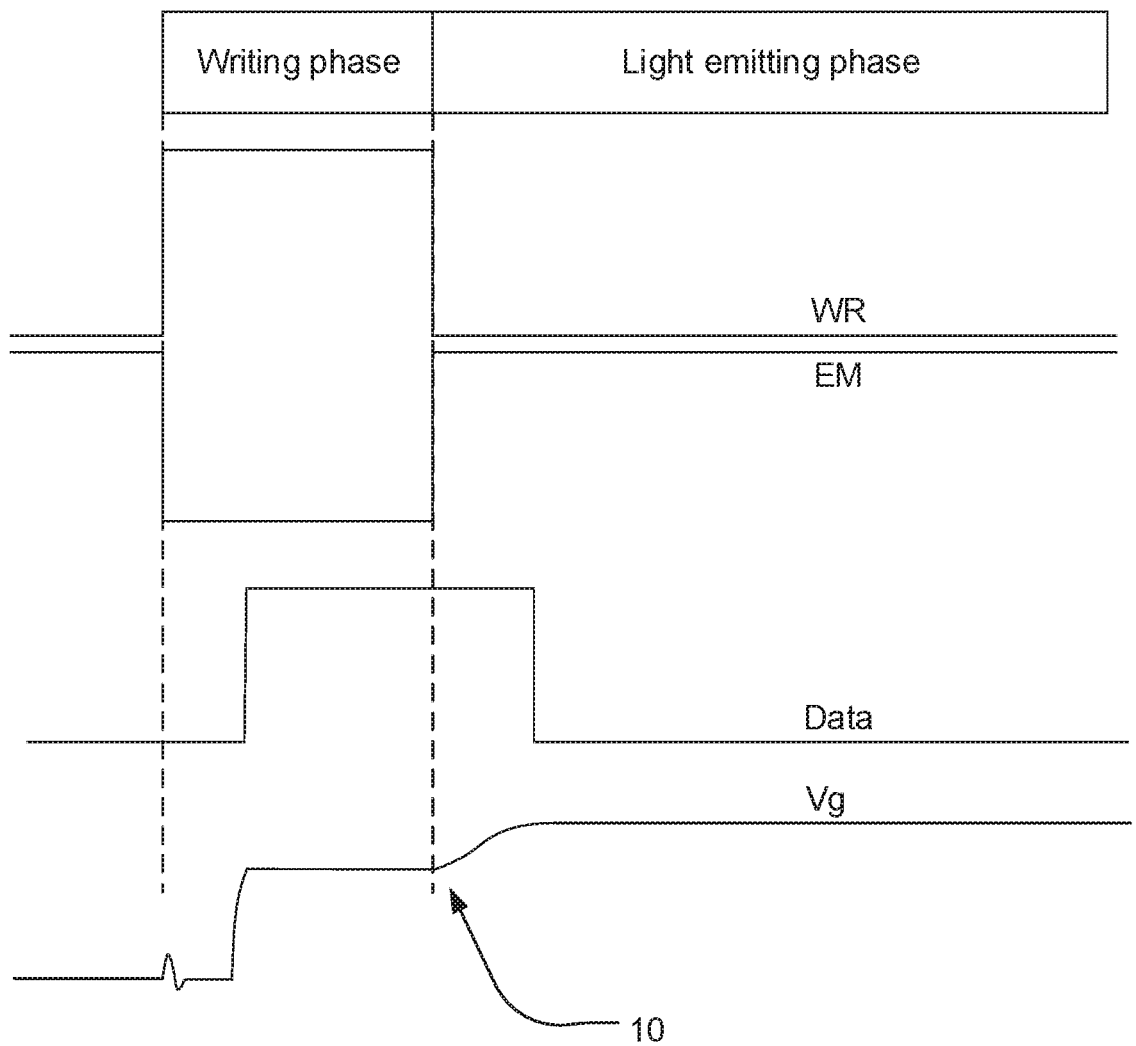
FIG. 4 is a timing diagram of a pixel hybrid compensation circuit according to an embodiment of the present invention.

Referring to FIG. 4, a combination of the writing signal (WR), the scan signal (EM), and the data signal (Data) corresponds to a writing phase and a light emitting phase in sequence.

In the writing phase, the write signal (WR) provides a high potential, the scan signal (EM) provides a low potential, and the data signal (Data) provides a high potential.

In the light emitting phase, the write signal (WR) provides a low potential, the scan signal (EM) provides a high potential, and the data signal (Data) provides a low potential.

In the writing phase, a difference between the low potential provided by the scan signal (EM) and a threshold voltage of the first thin film transistor is greater than a voltage of the data signal of a highest gray level.

A current test curve in FIG. 4 shows no fluctuations during the climb, and the current does not change significantly.

The pixel circuit comprises an NMOS circuit, a PMOS circuit, or a CMOS circuit.

An embodiment of the present invention provides a pixel circuit. By setting a compensation module, the compensation module is connected to a scan signal (EM). An end of the compensation module is connected to a first node (G), and another end of the compensation module is connected to a power supply voltage (VDD). The compensation module is configured to compensate a potential drop of the first node (G) due to coupling of the first capacitor (C1). This keeps a reference voltage Vgs constant, current flowing through a driving thin film transistor (i.e., the first thin film transistor) does not change, and a panel emits light uniformly.

An embodiment of the present invention further comprises a display panel comprising the pixel circuit, and the display panel is an active matrix organic light emitting diode (AMOLED) display panel.

An embodiment of the present invention further comprises a method of compensating a reference voltage of a pixel circuit, comprising following steps S1) to S3).

S1) providing the pixel circuit.

S2) entering a writing phase, in the writing phase, wherein the writing signal (WR) provides a high potential, the scan signal (EM) provides a low potential, and the data signal (Data) provides a high potential after a delay, the second thin film transistor (T2), the third thin film transistor (T3), and the fourth thin film transistor (T4) are all turned on, and the data signal (Data) and the reference voltage (Vref) write initial potentials to the first node (G) and the second node (S), respectively.

S3) entering a light emitting phase, in the light emitting phase, wherein the writing signal (WR) provides a low potential, the scan signal (EM) provides a high potential, and the data signal (Data) provides a low potential after a delay, the second thin film transistor (T2) and the third thin film transistor (T3) are turned off, and the power supply voltage (VDD) starts to charge the second node (S), the potential of the first node (G) decreases due to coupling of the first capacitor (C), the scan signal (EM) pulls the potential of the first node (G) high through the compensation module, so that the reference voltage Vgs remains unchanged.

It can be understood that for a person of ordinary skill in the art, equivalent replacements or changes can be made according to the technical solutions of the present application and its inventive concepts, and all these changes or replacements should fall within the protection scope of the claims attached to this present application.

What is claimed is:

1. A pixel circuit, comprising: a plurality of pixel internal driving circuits arranged in an array; each of the pixel internal driving circuits comprises: a first thin film transistor (T1), wherein a gate of the first thin film transistor (T1) is electrically connected to a first node (G), a source of the first thin film transistor is electrically connected to a second node (S); and a drain of the first thin film transistor is connected to a power supply voltage (VDD); a second thin film transistor (T2), wherein a gate of the second thin film transistor is connected to a writing signal (WR), a source of the second thin film transistor is connected to a data signal (Data), and a drain of the second thin film transistor is electrically connected to the first node (G); a first capacitor (C1), an end thereof is connected to the first node (G), and another end thereof is connected to the second node (S); a fourth thin film transistor (T4), wherein a gate of the fourth thin film transistor is connected to a reading signal (RD), a source of the fourth thin film transistor is electrically connected to the second node (S), and a drain of the fourth thin film transistor is electrically connected to a reference voltage signal (Ref); an organic light emitting diode (D1), wherein an anode of the organic light emitting diode (D1) is electrically connected to the second node (S), and a cathode of the organic light emitting diode (D1) is connected to a power supply voltage (VSS); and a compensation module connected to a scan signal (EM), wherein an end of the compensation module is connected to the first node (G), and another end thereof is connected to the power supply voltage (VDD) to compensate a potential drop of the first node (G) caused by coupling of the first capacitor (Cl); wherein: the compensation module comprises a third thin film transistor (T3) and a second capacitor (Cp); a gate of the third thin film transistor is connected to the scan signal (EM), a source of the third thin film transistor is electrically connected to the first node (G), and a drain of the third thin film transistor is electrically connected to an end of the second capacitor (Cp); another end of the second capacitor (Cp) is electrically connected to the power supply voltage (VDD), wherein the third thin film transistor (T3) has the same aspect ratio as the second thin film transistor (T2).

2. The pixel circuit according to claim 1, wherein:
the first thin film transistor (T1), the second thin film transistor (T2), the third thin film transistor (T3), and the fourth thin film transistor (T4) are all low temperature polysilicon thin film transistors, oxide semiconductor thin film transistors, or amorphous silicon thin film transistors.

3. The pixel circuit according to claim 1, wherein:
the writing signal (WR) and the scan signal (EM) are provided by an external timing controller; and/or
the scan signal (EM) is consistent with a delay load of the writing signal (WR).

4. The pixel circuit according to claim 1, wherein:
a combination of the writing signal (WR), the scan signal (EM), and the data signal (Data) corresponds to a writing phase and a light emitting phase in sequence;
in the writing phase, the write signal (WR) provides a high potential, the scan signal (EM) provides a low potential, and the data signal (Data) provides a high potential; and
in the light emitting phase, the write signal (WR) provides a low potential, the scan signal (EM) provides a high potential, and the data signal (Data) provides a low potential.

5. The pixel circuit according to claim 4, wherein:
in the writing phase, a difference between the low potential provided by the scan signal (EM) and a threshold voltage of the first thin film transistor is greater than a voltage of the data signal of a highest gray level.

6. The pixel circuit according to claim 1, further comprising an NMOS circuit, a PMOS circuit, or a CMOS circuit.

7. A method of compensating a reference voltage of a pixel circuit, comprising following steps:
providing the pixel circuit according to claim 1;
entering a writing phase, in the writing phase, wherein the writing signal (WR) provides a high potential, the scan signal (EM) provides a low potential, and the data signal (Data) provides a high potential after a delay, the second thin film transistor (T2), the third thin film transistor (T3), and the fourth thin film transistor (T4) are all turned on, and the data signal (Data) and the reference voltage (Vref) write initial potentials to the first node (G) and the second node (S), respectively;
entering a light emitting phase, in the light emitting phase, wherein the writing signal (WR) provides a low potential, the scan signal (EM) provides a high potential, and the data signal (Data) provides a low potential after a delay, the second thin film transistor (T2) and the third thin film transistor (T3) are turned off, and the power supply voltage (VDD) starts to charge the second node (S), the potential of the first node (G) decreases due to coupling of the first capacitor (C), the scan signal (EM) pulls the potential of the first node (G) high through the compensation module, so that the reference voltage Vgs remains unchanged.

8. A display panel, comprising: a pixel circuit; wherein the display panel is an active matrix organic light emitting diode (AMOLED) display panel; wherein the pixel circuit comprises a plurality of pixel internal driving circuits arranged in an array; wherein each of the pixel internal driving circuits comprises: a first thin film transistor (T1), wherein a gate of the first thin film transistor (T1) is electrically connected to a first node (G), a source of the first thin film transistor is electrically connected to a second node (S); and a drain of the first thin film transistor is connected to a power supply voltage (VDD); a second thin film transistor (T2), wherein a gate of the second thin film transistor is connected to a writing signal (WR), a source of the second thin film transistor is connected to a data signal (Data), and a drain of the second thin film transistor is electrically connected to the first node (G); a first capacitor (C1), an end thereof is connected to the first node (G), and another end thereof is connected to the second node (S); a fourth thin film transistor (T4), wherein a gate of the fourth thin film transistor is connected to a reading signal (RD), a source of the fourth thin film transistor is electrically connected to the second node (S), and a drain of the fourth thin film transistor is electrically connected to a reference voltage signal (Ref); an organic light emitting diode (D1), wherein an anode of the organic light emitting diode (D1) is electrically connected to the second node (S), and a cathode of the organic light emitting diode (D1) is connected to a power supply voltage (VSS); and a compensation module connected to a scan signal (EM), wherein an end of the compensation module is connected to the first node (G), and another end thereof is connected to the power supply voltage (VDD) to compensate a potential drop of the first node ((U) caused by coupling of the first capacitor (C1); wherein: the compensation module comprises a third thin film transistor (T3) and a second capacitor (Cp); a gate of the third thin film transistor is connected to the scan signal (EM), a source of the third thin film transistor is electrically connected to the first node (G), and a drain of the third thin film transistor is electrically connected to an end of the second capacitor (Cp); another end of the second capacitor (Cp) is electrically connected to the power supply voltage (VDD),
wherein the third thin film transistor (T3) has the same ratio as the second thin film transistor (T2).

9. The display panel according to claim 8, wherein:
the first thin film transistor (T1), the second thin film transistor (T2), the third thin film transistor (T3), and the fourth thin film transistor (T4) are all low temperature polysilicon thin film transistors, oxide semiconductor thin film transistors, or amorphous silicon thin film transistors.

10. The display panel according to claim 8, wherein:
the writing signal (WR) and the scan signal (EM) are provided by an external timing controller; and/or
the scan signal (EM) is consistent with a delay load of the writing signal (WR).

11. The display panel according to claim 8, wherein:
a combination of the writing signal (WR), the scan signal (EM), and the data signal (Data) corresponds to a writing phase and a light emitting phase in sequence;
in the writing phase, the write signal (WR) provides a high potential, the scan signal (EM) provides a low potential, and the data signal (Data) provides a high potential; and
in the light emitting phase, the write signal (WR) provides a low potential, the scan signal (EM) provides a high potential, and the data signal (Data) provides a low potential.

12. The display panel according to claim 8, wherein:
in the writing phase, a difference between the low potential provided by the scan signal (EM) and a threshold voltage of the first thin film transistor is greater than a voltage of the data signal of a highest gray level.

13. The display panel according to claim 8, wherein the pixel comprises an NMOS circuit, a PMOS circuit, or a CMOS circuit.

* * * * *